United States Patent
Aujol et al.

(10) Patent No.: US 8,557,042 B2
(45) Date of Patent: Oct. 15, 2013

(54) METHOD FOR MANUFACTURING A SINGLE CRYSTAL OF NITRIDE BY EPITAXIAL GROWTH ON A SUBSTRATE PREVENTING GROWTH ON THE EDGES OF THE SUBSTRATE

(75) Inventors: Eric Aujol, Vallauris (FR); Jean-Pierre Faurie, Valbonne (FR); Bernard Beaumont, Le Tignet (FR)

(73) Assignee: Saint-Gobain Cristaux et Detecteurs, Courbevoie (FR)

( * ) Notice: Subject to any disclaimer, the term of this patent is extended or adjusted under 35 U.S.C. 154(b) by 486 days.

(21) Appl. No.: 12/516,564

(22) PCT Filed: Dec. 8, 2006

(86) PCT No.: PCT/EP2006/069474
§ 371 (c)(1),
(2), (4) Date: Aug. 27, 2009

(87) PCT Pub. No.: WO2008/067854
PCT Pub. Date: Jun. 12, 2008

(65) Prior Publication Data
US 2010/0074826 A1    Mar. 25, 2010

(51) Int. Cl.
*C30B 23/00* (2006.01)
(52) U.S. Cl.
USPC .......................................................... 117/95
(58) Field of Classification Search
USPC .................... 423/409; 117/95, 200
See application file for complete search history.

(56) References Cited

U.S. PATENT DOCUMENTS

| 4,736,070 | A | 4/1988 | Girard |
| 5,212,113 | A * | 5/1993 | Azoulay et al. ............... 438/504 |
| 5,585,648 | A | 12/1996 | Tischler |
| 5,661,074 | A | 8/1997 | Tischler |
| 6,001,748 | A | 12/1999 | Tanaka et al. |
| 6,156,581 | A | 12/2000 | Vaudo et al. |
| 6,325,850 | B1 | 12/2001 | Beaumont et al. |
| 6,413,627 | B1 | 7/2002 | Motoki et al. |
| 6,440,823 | B1 | 8/2002 | Vaudo et al. |
| 6,447,604 | B1 | 9/2002 | Flynn et al. |
| 6,468,347 | B1 | 10/2002 | Motoki et al. |
| 6,533,874 | B1 | 3/2003 | Vaudo et al. |
| 6,582,986 | B2 | 6/2003 | Kong et al. |

(Continued)

FOREIGN PATENT DOCUMENTS

| CN | 1882720 A | 12/2006 |
| EP | 0 057 587 | 8/1982 |

(Continued)

OTHER PUBLICATIONS

Chu, T.L., et al. "Crystal Growth and Characterization of Gallium Nitride," *J. Electrochem. Soc.: Solid-State Science and Technology*, vol. I, No. 121, Jan. 1974, pp, 159-162, Electronic Sciences Center, Southern Methodist University, Dallas, Texas.

*Primary Examiner* — Melvin C Mayes
*Assistant Examiner* — Stefanie Cohen
(74) *Attorney, Agent, or Firm* — Abel Law Group, LLP; Robert N. Young

(57) ABSTRACT

A method for manufacturing a single crystal of nitride by epitaxial growth on a substrate appropriate for the growth of the crystal. The substrate includes, deposited on the edges of its growth surface, a mask appropriate to prevent growing of the single crystal on the edges of the substrate.

16 Claims, 1 Drawing Sheet

(56) References Cited

U.S. PATENT DOCUMENTS

| | | |
|---|---|---|
| 6,596,079 B1 | 7/2003 | Vaudo et al. |
| 6,649,494 B2 | 11/2003 | Tamura et al. |
| 6,693,021 B1 | 2/2004 | Motoki et al. |
| 6,765,240 B2 | 7/2004 | Tischler et al. |
| 6,803,602 B2 | 10/2004 | Kong et al. |
| 6,812,053 B1 | 11/2004 | Kong et al. |
| 6,955,977 B2 | 10/2005 | Kong et al. |
| 6,958,093 B2 | 10/2005 | Vaudo et al. |
| 6,972,051 B2 | 12/2005 | Tischler et al. |
| 7,282,381 B2 | 10/2007 | Feltin et al. |
| 2004/0137732 A1 | 7/2004 | Frayssinet et al. |

FOREIGN PATENT DOCUMENTS

| | | |
|---|---|---|
| FR | 2 366 871 | 5/1978 |
| JP | 62-97361 | 5/1987 |
| JP | 2000133808 A | 5/2000 |
| JP | 2002316893 A | 10/2002 |
| WO | WO 2004/105108 A2 | 12/2004 |
| WO | 2005031045 A2 | 4/2005 |
| WO | WO 2005/031045 A2 | 4/2005 |

* cited by examiner

METHOD FOR MANUFACTURING A SINGLE CRYSTAL OF NITRIDE BY EPITAXIAL GROWTH ON A SUBSTRATE PREVENTING GROWTH ON THE EDGES OF THE SUBSTRATE

The present patent application is a national phase application of International Application No. PCT/EP2006/069474, filed Dec. 8, 2006.

The present invention concerns a new method for the manufacture of single crystals of nitrides, such as gallium nitride (GaN), aluminium nitride (AlN) and mixtures thereof, by epitaxial growth on a substrate.

Methods for the epitaxial growth of single crystals of nitrides are well known in the art. Properties of single crystals of various sizes were already disclosed by Chu & al in 1974 (J. Electrochem. Soc.: SOLID-STATE SCIENCE AND TECHNOLOGY, January 1974, 159-162). Improved methods for their preparations are the object of several patents and patent applications, including U.S. Pat. Nos. 6,812,053, 6,582,986, 6,803,602, 6,955,977, 6,468,347, 6,693,021, 6,413,627, 6,001,748, 6,156,581, 6,765,240, 6,972,051, 6,533,874, 6,440,823, 6,156,581, 5,661,074, 5,585,648, 6,958,093, 6,765,240, 6,972,051, 6,596,079, 6,447,604, 6,596,079, 6,325,850, US 2004/0137732 and WO 2005/031045.

These methods generally comprise growing the crystal on a substrate, said substrate comprising a growth surface. One critical step for obtaining a free standing crystal is to separate the single crystal from the growth layer without substantially damaging the crystal. Different solutions are known to ease such separation, such as including at least one sacrificial layer in the substrate, between a base layer and a crystalline upper growth layer. However, under the stringent conditions for crystal growth, the single crystal may extend its growth to and over the edges of the growing surface. Such extensions of growth may raise additional problems of separation of the crystal from the substrate.

The present invention provides a solution to this problem.

BRIEF DISCLOSURE OF THE INVENTION

The present invention concerns a method for manufacturing a single crystal of nitride by epitaxial growth on a substrate appropriate for the growth of the said crystal, wherein the substrate comprises, deposited on the edges of its growth surface, a mask appropriate to prevent growing of the said single crystal on the edges of the substrate. The mask is preferably constituted with resin material.

The substrate preferably comprises a base layer and an upper crystalline layer compatible with the growth of the nitride crystal, eventually with at least one sacrificial layer between the base layer and the upper layer.

The present invention also concerns the substrate used for the method according to the invention and the single crystal of nitride obtained by the same method.

Figure 1:
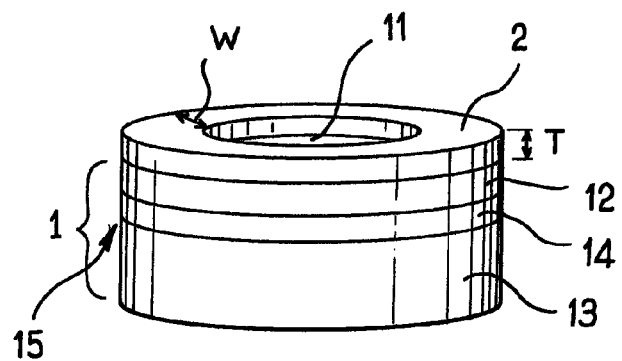
FIG. 1 represents a perspective view of a substrate (1) comprising a mask (2) according to the invention.
Figure 2:
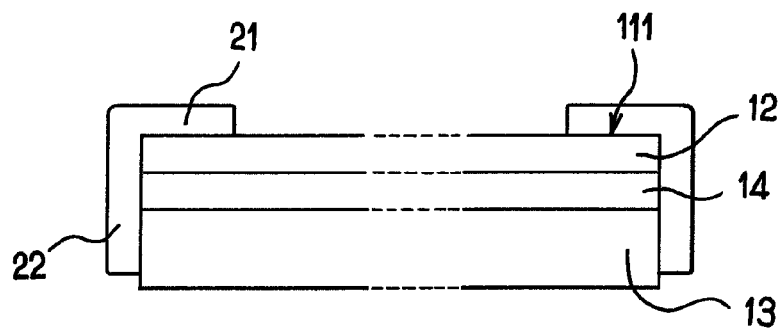
FIG. 2 represents a cross view of a substrate (1) comprising a mask (2) according to the invention.
Figure 3:
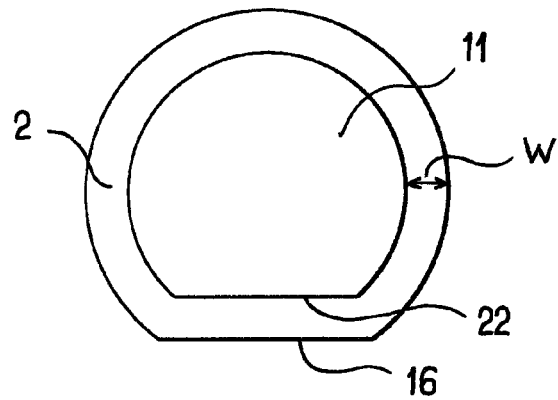
FIG. 3 represents a view from the top of the substrate (1), where the mask (2) comprises a plane parallel to a plane (16) on the substrate (1).

Detailed description of the invention below may refer to these figures. Except otherwise specified in the disclosure, such references are for information purpose only and characteristics of the invention are also understood to be applicable to other embodiments.

DETAILED DISCLOSURE OF THE INVENTION

In the method according to the invention, the substrate (1) appropriate for the growth of the crystal comprises, deposited on the edges of its growth surface (11), a mask (2) appropriate to prevent growing of the said single crystal over the edges of the substrate According to the present invention, the "edges of the substrate" means the periphery (111) of the surface (11) of the substrate and/or the "vertical" edges (15) of the substrate. "Vertical" is used herein by reference to a substrate which growth surface (11) growth would be maintained horizontal.

The mask (2) preferably covers at least the periphery (111) of the growth surface. Most preferably it covers both the periphery (111) of the growth surface (11) and the vertical edges (15). It comprises a peripheral element (21) and a vertical element (22). Both peripheral (21) and vertical (22) element are preferably parts of a same continuous element.

Substrates (1) are well known in the art of epitaxial growth of crystals such as nitride single crystals. Such substrates are disclosed in the art, published, inter alia, in all patent and patent applications mentioned above and incorporated herein by reference. They generally comprise a base layer (13) and an upper crystalline layer (12) compatible with and promoting growth of the single crystal. The base layer has a first mechanical function to support the growth layer and the single crystal to be grown. The upper crystalline layer has a main function to allow growth of the crystal. In a first embodiment of the invention, the base layer and the upper crystalline layer are the same. In other preferred embodiments of the invention, the base layer and the upper crystalline layer are two distinct layers. These two layers may be constituted with the same material or with two different materials.

The upper crystalline layer is advantageously chosen among the group consisting of sapphire, spinel, GaN, AlN, GaAs, Si, SiC (6H—, 4H—, 3C—), $LiAlO_2$, $LiGaO_2$, $ZrB_2$, $HfB_2$ and mixtures thereof, preferably an AlN or GaN crystalline material.

When the base layer is distinct form the upper crystalline layer, it may be made of any material compatible with the support and recovery of the single crystal after growth. It can be made of amorphous or crystalline materials. In preferred embodiments, the base layer is made of crystalline materials. It can be, like for the upper crystalline layer made of sapphire, spinel, GaN, AlN, GaAs, Si, SiC (6H—, 4H—, 3C—), $LiAlO_2$, $LiGaO_2$, $ZrB_2$, $HfB_2$ and mixtures thereof. The base layer is preferably a sapphire layer.

In preferred embodiments of the invention, the substrate comprises at least one sacrificial layer (14) between the base layer and the upper layer. Such sacrificial layers are well known in the art, such as disclosed in WO 2005/031045 incorporated herein by reference. It is preferably made of silicium.

In preferred embodiments, the resin is selected among the group consisting of photosensitive resins, particularly used in photolithography. Such resins are well known in the art and includes products sold under names AZ1512HS or AZ1518HS by Clariant Electronics Division (Rohm & Haas Division), MiPr 6512/6517 by Fujifilm Electronic Materials Inc., WPR 1020 by JSR Micro, Inc or SIPR 7120-20 by SHIN ETSU MicroSi, Inc.

The resin allows designing any form to the substrate for the single crystal to be grown. These forms may include marks (22), like planes, to keep information on the crystalline orientation for the single crystal after growth.

With the crystal having a lateral growth along with a vertical growth, the width W is the width necessary to prevent the crystal to grow over the edges of the substrate. The minimum width is therefore dependent upon the thickness of the final crystal intended to be grown. The maximum width W then depends upon the size of the single crystal. In most common embodiments, the width W of the mask is at least about 1 mm, comprised from about 1 mm to about 2 mm.

The thickness T of the mask will be dependent upon at least two factors known to the skilled person:
  the method used for the application of the mask material onto the growth surface of the substrate, and
  the need for the mask to resist the temperature conditions used for epitaxial growth of the single crystal.

Methods used for application of the mask onto the growth surface of the substrate are known for the various mask materials susceptible to be used. As preferred embodiment, the resin may be applied either by "painting" or by printing like ink jet printing. Applying the resin by painting needs after application to cure the resin at the appropriate shape using usual technology well known in photolithography, like using further masks to avoid exposure of the resin during the curing step to be able to remove the uncured resin and maintain only the cured resin with the appropriate shape. On the other hand, using a printing technology such as jet ink printing technology may allow applying the resin only where it is needed and then cure it without need of using a mask and removing the uncured resin.

In preferred embodiments the mask has a thickness T of from about 1 to about 3 μm, preferably from 1 to 2 μm.

The shape and size of the growing surface defined by the mask may vary upon the desired shape and size of the crystal to be produced. According to a general embodiment, said surface is circular, eventually truncated with planes (22) to keep information on the crystal orientation. Said surface generally comprises a circle. The diameter of said circle is generally of at least 50 mm.

The single crystal of nitride obtained by the method according to the invention preferably comprises GaN, AlN and mixture thereof, preferably GaN. In preferred embodiments, it consists essentially of GaN, AlN and mixture thereof. Nitride crystals according to the invention may be represented with the following formula:

$$Al_xGa_yIn_zN$$

Wherein x+y+z=1 and at least one of x+y+z is not 0.

It may however comprise other elements well known in the art of nitride crystals, like oxygen. Such doped crystals and the methods for their preparations are known in the art. The relative proportions of additional elements in these doped nitride crystals may vary according to the final properties of the crystal intended to be prepared.

Thickness of the single crystal depends on the time allowed for its growth. Growing conditions and ways to obtain crystals of different sizes are well known in the art including in the publications cited above. The single crystal obtained has generally a thickness of more than 1 μm, preferably from 100 μm to 10 cm, more preferably from 500 μm to 3 mm.

After growth, the single crystal is preferably removed from the substrate layer and eventually wafered. Methods for removing the crystal from the substrate and methods for their wafering are well known in the art of single crystals production. The top and the bottom surface of the free single crystal as well as the edges are generally further polished or grinded using method also known to the skilled person.

The present invention also concerns the substrate as defined above, comprising the mask. It also concerns the single crystal on the substrate and the crystal obtained by the method according to the invention.

EXAMPLE 1

Production of a Free Standing GaN with a Sacrificial Layer Using a Mask Deposited on the Periphery of the Substrate The separation process uses a sacrificial layer of Silicium (Si), although other material could be used, which thickness is 0.3 μm. (111) Si is deposited by CVD on (0001) sapphire. Other crystallographic directions for the Si sacrificial layer like <110> are suitable specifically for the growth of non polar {11-22} a-plane GaN, this however requires R-plane sapphire as starting substrate. Advantageously the (111) Si layer is deposited directly in the MOVPE reactor from pure silane.

Direct growth of GaN on (111)Si by MOVPE does not lead to high quality layers. Conversely, a layer like SiC or AlN has proven to be beneficial for the quality of the GaN layer. Thus 0.15 μm thick AlN layer is deposited on (111)Si by MOVPE using growth process well known by the skilled person in the art.

At this stage, the substrate (1) is formed by a base layer (13) made of sapphire, a sacrificial layer (13) made of silicon and a crystalline layer (12) compatible with GaN growth made of AlN.

According to the present invention the next step is to form a mask at the periphery of the substrate. To this end, the substrate is loaded in a resist dispensing set up; the resist for example Rohm and Haas S1813 is poured and spin to form a thin film on the substrate. After resist curing on a hot plate, UV lithography is used to transfer a pattern from a lithography mask to the resist film i.e. a ring like pattern covering both the vertical edge and 1.3 mm width from the outer diameter. A flat is included in the pattern to be aligned parallel to the crystalline orientation flat of the sapphire base. A final step consists in solving the resist in a specific developer to expose the growth area 11 for further regrowth by HVPE technique.

The HVPE growth starts at about 950° C. In this low temperature step of growing a thick GaN layer by HVPE, the temperature is set at 930-950° C., the partial pressure of HCl, pHCl at 0.03, of NH3, pNH3 at 0.24, the carrier gas, H2, pH2 at 0.73 respectively. The growing pressure was 2.6 kPa. Growth is carried out during 10 hours at a growth rate of about 100 μm/h.

At this rather low temperature, GaN grows in the form of coherent island, randomly distributed with random size, having facets.

After the low temperature step, growth temperature is set up to 1015-1020° C., with the following values for the partial pressures of active and carrier gas:
  pHCl, 0.02
  PNH3, 0.31
  pH2, 0.67
  Working pressure: 2.6 kPa In these growth conditions, the lateral growth rate is enhanced and the layer becomes flat. This corresponds to 2D growth of GaN parallel to the basal plane.

During this second high temperature step, where lateral growth is enhanced, the sacrificial Si interlayer evaporates and a clean separation takes place between the base material surface and the typically 1 mm thick GaN layer grown by HVPE.

Due to the existence of the mask following the present invention, no GaN growth occurs or a very thin and brittle polycrystalline GaN deposit is formed on the periphery of the base material. Therefore the edges of the GaN thick layers are bonded neither to the periphery 111 of the base layer 14 nor the vertical edge of the base layer 14. This mask is extremely efficient to avoid the building of detrimental strain into the thick GaN layer from its edges. Such a compressive or tensile strain would build up during cooling down after the growth due to the possible thermal coefficient mismatch between GaN and the base material; when existing this strain would initiate cracks in the thick GaN layer.

Another advantage of the present invention is the very easy and reproducible separation of the thick GaN layer from the base material since the GaN layers is not bonded to the surface 11 due to the sacrificial layer disappearance and since no bonds exists at its edges. No mechanicals efforts needs to be applied that may damage or break the GaN layer.

Such a process produces free standing GaN 2" wafers with TDs density in the low $10^6$ cm$^{-2}$.

What is claimed is:

1. A substrate appropriate for the growth of a nitride single crystal by epitaxial growth, wherein the substrate comprises a base layer and an upper crystalline layer compatible with the growth of the nitride crystal and sacrificial layer between the base layer and the upper layer, and wherein the substrate comprises a mask deposited on an edge of a growth surface configured to prevent growing of the nitride single crystal on the a vertical surface of the substrate.

2. The substrate of claim 1, wherein the mask comprises a resin.

3. The substrate of claim 1, wherein the mask has a width W of about 1 mm.

4. The substrate of claim 1, wherein the mask has a thickness T of from about 1 to about 3 μm.

5. The substrate of claim 1, wherein the upper crystalline layer comprises a material selected from the group consisting of sapphire, spinel, GaN, AlN, GaAs, Si, SiC (6H—, 4H—, 3C—), LiAlO$_2$, LiGaO$_2$, ZrB$_2$, HfB$_2$.

6. The substrate of claim 1, wherein the upper layer comprises AlN.

7. The substrate of one of claims 1, wherein the base layer comprises sapphire.

8. The substrate of claim 1, wherein the sacrificial layer is in direct contact with the base layer and the upper layer.

9. The substrate of claim 8, wherein the sacrificial layer comprises silicon.

10. The substrate of claim 1, wherein the the nitride single crystal is configured to be grown in an area within the perimeter of the mask.

11. The substrate of claim 10, wherein the mask comprise a circle having a diameter of at least 50 mm.

12. The substrate of claim 1, wherein the upper layer comprises GaN.

13. The substrate of claim 1, wherein the nitride single crystal comprises a thickness of more than 100 μm.

14. The substrate of claim 1, wherein the mask has a ring-like shape comprising a flat configured to align with an orientation flat of the substrate.

15. The substrate of claim 1, wherein the mask comprises a vertical element overlying the vertical surface of the substrate.

16. The substrate of claim 15, wherein the vertical element is continuous with a peripheral element of the mask, wherein the peripheral element overlies a periphery of the growth surface of the substrate.

* * * * *

UNITED STATES PATENT AND TRADEMARK OFFICE
CERTIFICATE OF CORRECTION

PATENT NO.       : 8,557,042 B2  
APPLICATION NO.  : 12/516564  
DATED            : October 15, 2013  
INVENTOR(S)      : Eric Aujol et al.

Page 1 of 1

It is certified that error appears in the above-identified patent and that said Letters Patent is hereby corrected as shown below:

In the Claims

Column 5, line 32, please delete "the a" and insert --a--.
Column 6, line 9, please delete "one of claims 1" and insert --claim 1--.
Column 6, line 19, please delete "comprise" and insert --comprises--.

Signed and Sealed this
Twenty-first Day of October, 2014

Michelle K. Lee
*Deputy Director of the United States Patent and Trademark Office*